(12) United States Patent
Saito et al.

(10) Patent No.: US 11,189,685 B2
(45) Date of Patent: Nov. 30, 2021

(54) RESISTANCE ELEMENT AND MANUFACTURING METHOD OF RESISTANCE ELEMENT

(71) Applicant: FUJI ELECTRIC CO., LTD., Kawasaki (JP)

(72) Inventors: Masaru Saito, Matsumoto (JP); Masaharu Yamaji, Matsumoto (JP); Osamu Sasaki, Azumino (JP); Hitoshi Sumida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 5 days.

(21) Appl. No.: 16/455,128

(22) Filed: Jun. 27, 2019

(65) Prior Publication Data

US 2020/0044011 A1  Feb. 6, 2020

(30) Foreign Application Priority Data

Aug. 3, 2018  (JP) .............................. JP2018-146880

(51) Int. Cl.
 *H01L 49/02*  (2006.01)
(52) U.S. Cl.
 CPC .................................... *H01L 28/24* (2013.01)
(58) Field of Classification Search
 CPC ........ H01L 28/20; H01L 28/24; H01L 23/647

USPC ......................................................... 257/538
See application file for complete search history.

(56) References Cited

U.S. PATENT DOCUMENTS 5,726,474 A * 3/1998 Miller ................. H01L 29/4238
257/364
2002/0175379 A1* 11/2002 Ueyanagi ............ H01L 27/0802
257/359

FOREIGN PATENT DOCUMENTS

JP  8-306861 A  11/1996

* cited by examiner

*Primary Examiner* — Matthew E. Gordon
*Assistant Examiner* — Gardner W. S. Swan (57) ABSTRACT

Provided is a resistance element, including: a semiconductor substrate; a first insulating film stacked on the semiconductor substrate; a resistance layer selectively stacked on the first insulating film; a first auxiliary film separated from the resistance layer; a second auxiliary film separated from the resistance layer in a direction different from that of the first auxiliary film; a second insulating film stacked on the first insulating film to cover the resistance layer, and the first auxiliary film and the second auxiliary film; a first electrode connected to the resistance layer and stacked on the second insulating film disposed on an upper side of the first auxiliary film; and a second electrode connected to the resistance layer by being separated from the first electrode and stacked on the second insulating film on the upper side of the second auxiliary film.

3 Claims, 7 Drawing Sheets

RESISTANCE ELEMENT AND MANUFACTURING METHOD OF RESISTANCE ELEMENT

CROSS-REFERENCE TO RELATED APPLICATIONS

This application claims benefit of priority under 35 U.S.C. § 119 to Japanese Patent Application No. 2018-146880, filed on Aug. 3, 2018, the entire contents of which is incorporated by reference herein.

TECHNICAL FIELD

The present invention relates to a resistance element and a manufacturing method of the resistance element.

BACKGROUND

A resistance element in which a first insulating layer is stacked on a silicon substrate, a thin resistance layer is stacked on the first insulating layer, and a second insulating film is stacked on the resistance layer such that lateral sides of the resistance layer, facing each other, are exposed, is known as a resistance element for a semiconductor device such as a semiconductor integrated circuit (IC) (for example, refer to Japanese Patent Application Laid-Open No. 8-306861 (PTL 1).) In the resistance element described in PTL 1, two electrodes are stacked on the second insulating film to extend, and a bonding wire is connected to two electrodes.

However, in the resistance element described in PTL 1, in a case where a crack is generated in the second insulating film at the time of performing wire bonding, there is a possibility that a short circuit occurs between the electrode and the resistance layer.

SUMMARY

In consideration of the problem described above, an object of the invention is to provide a resistance element capable of preventing a short circuit between an electrode and a resistance layer, and a manufacturing method of the resistance element.

One aspect of the invention is a resistance element, including: (a) a semiconductor substrate; (b) a first insulating film stacked on the semiconductor substrate; (c) a resistance layer selectively stacked on the first insulating film; (d) a first auxiliary film separated from the resistance layer; (e) a second auxiliary film separated from the resistance layer in a direction different from a direction of the first auxiliary film; (f) a second insulating film stacked on the first insulating film to cover the resistance layer, and the first auxiliary film and the second auxiliary film; (g) a first electrode connected to the resistance layer and stacked on the second insulating film disposed on an upper side of the first auxiliary film; and (h) a second electrode connected to the resistance layer by being separated from the first electrode and stacked on the second insulating film on the upper side of the second auxiliary film.

Another aspect of the invention is a manufacturing method of a resistance element, including: (a) forming a first insulating film on a semiconductor substrate; (b) selectively forming a resistance layer, a first auxiliary film separated from the resistance layer, and a second auxiliary film separated from the resistance layer in a direction different from a direction of the first auxiliary film, on the first insulating film, respectively; (c) depositing a second insulating film on the first insulating film to cover the resistance layer, and the first auxiliary film and the second auxiliary film; (d) boring a first contact hole exposing a part of the resistance layer on the first auxiliary film side, a second contact hole exposing a part of the resistance layer on the second auxiliary film side, in the second insulating film, respectively; and (e) forming a first electrode connected to the resistance layer through the first contact hole, on an upper side of the first auxiliary film, and a second electrode connected to the resistance layer through the second contact hole, on an upper side of the second auxiliary film, respectively.

DETAILED DESCRIPTION

Hereinafter, a resistance element and a manufacturing method of the resistance element according to the embodiment of the invention will be described with reference to Drawings. In the description of Drawings, the same or similar reference numerals will be applied to the same or similar portions, and the repeated description will be omitted. However, Drawings are schematic, and there is a case where a relationship between a thickness and a planar dimension, a thickness ratio of each layer, and the like are different from the actual ones. In addition, in Drawings, there is a case where a portion having a different dimensional relationship or a different ratio is included. In addition, the following embodiment exemplifies a device or a method for specifying the technical idea of the invention, and the technical idea of the invention does not specify the material, the shape, the structure, the arrangement, and the like of constituents to the followings. In addition, the definition of a direction such as up and down in the following description is merely a definition for convenience of the description, and does not limit the technical idea of the invention. For example, it is obvious that in a case where a target is rotated by 90° and is observed, up and down are read by being converted into right and left, and in a case where the target is rotated by 180° and is observed, up and down are read by being inverted.

Structure of Resistance Element

Figure 1:
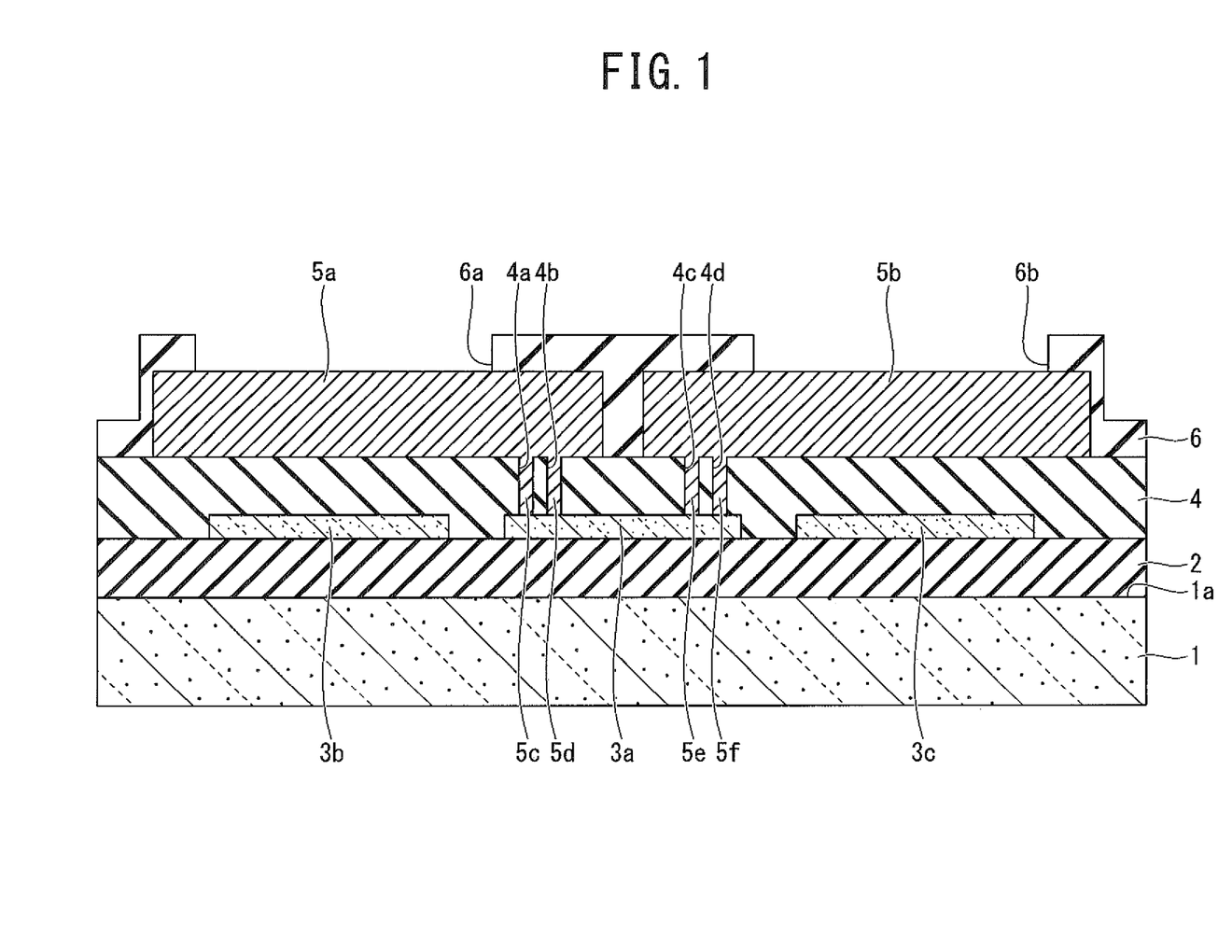
FIG. 1 is a sectional view illustrating an example of a resistance element according to an embodiment of the invention.
Figure 2:
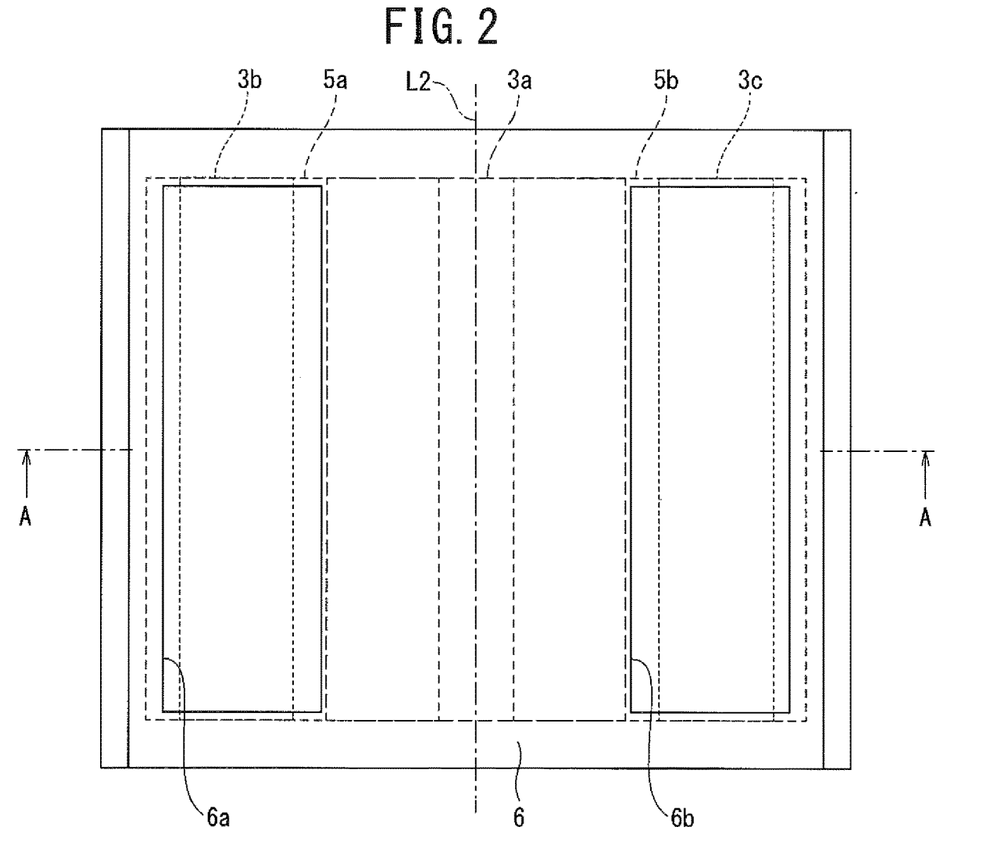
FIG. 2 is a plan view illustrating an example of the resistance element according to the embodiment of the invention.

As illustrated in FIG. 1, a resistance element according to an embodiment of the invention is based on a first insulating film 2 stacked on one surface 1a of a semiconductor substrate 1, and a pattern of a resistance layer 3a, and a first auxiliary film 3b and a second auxiliary film 3c respectively formed on the first insulating film 2. As illustrated in FIG. 2, the first auxiliary film 3b is a planar pattern separated from the resistance layer 3a, and the second auxiliary film 3c is a planar pattern separated from the resistance layer 3a in a direction different from that of the first auxiliary film 3b. As illustrated in FIG. 1, a second insulating film 4 (an interlayer insulating film), a first electrode 5a (a surface electrode) and a second electrode 5b (a surface electrode), and a protective film 6 are laminated in this order on the resistance layer 3a, the first auxiliary film 3b and the second auxiliary film 3c. A sectional view when seen from an A-A direction of FIG. 2 corresponds to FIG. 1. As illustrated in FIG. 2, the resistance element according to the embodiment of the invention, for example, includes a rectangular planar pattern having a direction in which the first electrode 5a and the second electrode 5b are arranged, as a longitudinal direction. A chip size of the resistance element according to the embodiment of the invention, for example, is approximately 2.8 mm×2.5 mm.

The thickness of the semiconductor substrate 1, for example, is approximately 250 μm to 450 μm. For example, a silicon substrate to which an n-type impurity is added at a high concentration can be used as the semiconductor substrate 1. In addition, for example, the semiconductor substrate 1 may be a silicon substrate to which a p-type impurity is added at a high concentration, a silicon substrate to which the n-type impurity or the p-type impurity is not added at a high concentration, or a semiconductor substrate other than silicon.

The thickness of the first insulating film 2, for example, is approximately 600 nm to 1000 nm. For example, a silicon oxide-film (an $SiO_2$ film), a silicon nitride-film (an $Si_3N_4$ film), or a composite film of the films described above can be used as the first insulating film 2. In addition, for example, the first insulating film 2 may be an insulating film (a TEOS film) according to a chemical vapor deposition (CVD) method using tetraethoxysilane (TEOS) gas of an organic silicon-based compound.

As illustrated in FIG. 2, the resistance layer 3a includes a rectangular planar pattern having a transverse direction of the resistance element as the longitudinal direction. In addition, the thickness of the resistance layer 3a, for example, is approximately 400 nm to 600 nm. Further, a sheet resistance of the resistance layer 3a, for example, is approximately 100 Wsquare to 200 Wsquare. A resistance value of the resistance layer 3a can be controlled by adjusting the width and the height of the resistance layer 3a, and the like. For example, n-type doped-polysilicon can be used as the resistance layer 3a. The n-type doped-polysilicon can be formed according to ion implantation of an n-type impurity such as phosphorus (P) with respect to polycrystalline silicon (polysilicon), and the addition of an n-type impurity during the deposition of the polycrystalline silicon with a CVD device.

Figure 3:
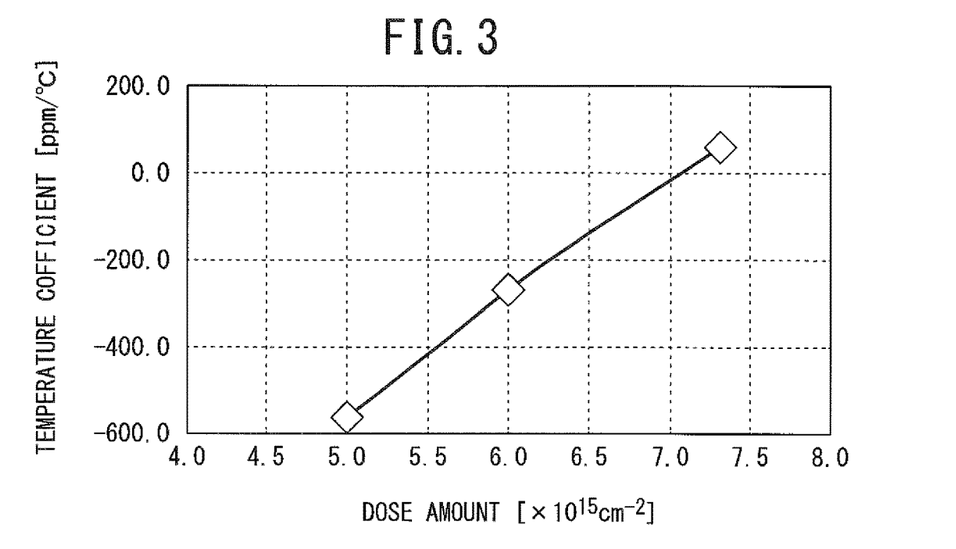
FIG. 3 is a graph illustrating a relationship between a temperature coefficient and a dose amount of doped-polysilicon.

It is preferable that a temperature coefficient of the resistance layer 3a is 0, or the resistance layer 3a has a negative temperature coefficient. Accordingly, it is possible to suppress an increase in the resistance value at the time of performing a high temperature operation. For example, in a case where the resistance element according to the embodiment of the invention is applied to a gate resistance of an IGBT, it is possible to suppress a loss when the IGBT is turned on. A temperature coefficient of the n-type doped-polysilicon can be controlled by adjusting a dose amount at the time of ion-implanting the n-type impurity with respect to the polysilicon, and the like. FIG. 3 illustrates a relationship between a temperature coefficient and a dose amount of the n-type doped-polysilicon formed by ion-implanting phosphorus (P). For example, in a case where the dose amount is approximately less than or equal to $7.0 \times 10^{15}$ $cm^{-2}$, a temperature coefficient of the doped-polysilicon can be approximately less than or equal to 0 ppm/° C. Furthermore, the temperature coefficient of the resistance layer 3a is not necessarily limited to be less than or equal to 0 ppm/° C., and the resistance layer 3a may have a positive temperature coefficient.

In addition, the resistance layer 3a, for example, may be p-type doped-polysilicon. The p-type doped-polysilicon can also be formed by a method such as the ion implantation of the p-type impurity such as boron (B) with respect to the polycrystalline silicon (the polysilicon). In addition, the resistance layer 3a is not limited to the doped-polysilicon, and may be a nitride film of a transition metal such as tantalum nitride ($TaN_x$), and a laminated film of high-melting point metal films laminated in the order of chromium (Cr)-nickel (Ni)-manganese (Mn). In addition, a thin film of silver palladium (AgPd), ruthenium oxide ($RuO_2$), and the like may be used as the resistance layer 3a. Furthermore, although it is different from the structure illustrated in FIG. 1, the resistance layer 3a can also be realized by a p-type diffusion layer or an n-type diffusion layer in which the resistance layer 3a is formed on the surface of the semiconductor substrate 1.

As illustrated in FIG. 2, the first auxiliary film 3b and the second auxiliary film 3c include a rectangular planar pattern having the transverse direction of the resistance element as the longitudinal direction. FIG. 2 exemplarily illustrates a case where the planar pattern of the first auxiliary film 3b and the second auxiliary film 3c is a symmetrical structure having a similar shape. The first auxiliary film 3b and the second auxiliary film 3c are arranged in a one-dimensional direction by interposing the resistance layer 3a between the first auxiliary film 3b and the second auxiliary film 3c, and by being separated from the resistance layer 3a. That is, the first auxiliary film 3b and the resistance layer 3a, and the resistance layer 3a and the second auxiliary film 3c are arranged in parallel to each other at a predetermined interval. For example, a material identical to that of the resistance layer 3a can be used as the first auxiliary film 3b and the second auxiliary film 3c. The thickness of the first auxiliary film 3b and the second auxiliary film 3c, for example, is approximately identical to that of the resistance layer 3a.

As illustrated in FIG. 1, the second insulating film 4 is stacked on the first insulating film 2 to cover the resistance layer 3a. The second insulating film 4 also covers the first insulating film 2 that is exposed to a portion in which the resistance layer 3a is not provided. The thickness of the second insulating film 4, for example, is approximately 1000 nm to 2000 nm, in a portion where the resistance layer 3a is not provided. For example, a silicon oxide-film (an $SiO_2$ film) referred to as a so-called an "NSG film" in which phosphorus (P) or boron (B) is not contained, a silicon oxide-film (a PSG film) to which phosphorus is added, a silicon oxide-film (a BSG film) to which boron is added, a silicon oxide-film (a BPSG film) to which phosphorus and boron are added, a silicon nitride-film (an $Si_3N_4$ film), or a composite film of the films described above can be used as the second insulating film 4. In addition, for example, the second insulating film 4 may be a composite film in which the NSG film of approximately 500 nm to 800 nm and the PSG film of approximately 400 nm to 800 nm are laminated. The NSG film has a function of suppressing a resistance variation. In addition, the PSG film has a function of ensuring the strength of the wire bonding.

In addition, in the second insulating film 4, first contact holes 4a and 4b penetrating in a thickness direction of the resistance element are bored in a portion positioned on an end portion of the resistance layer 3a on the first auxiliary film 3b side. Further, in the second insulating film 4, second contact holes 4c and 4d penetrating in the thickness direction of the resistance element are bored in a portion positioned on an end portion of the resistance layer 3a on the second auxiliary film 3c side.

The first electrode 5a is arranged in a position on an upper side of the first auxiliary film 3b such that a lower surface of an end portion of the first electrode 5a on the second electrode 5b side faces the end portion of the resistance layer 3a on the first auxiliary film 3b side. The lower surface of the end portion of the first electrode 5a on the second electrode 5b side includes first contact regions 5c and 5d extending to an upper surface of the resistance layer 3a through the first contact holes 4a and 4b, as a protrusion. In addition, the second electrode 5b is arranged in a position on the upper side of the second auxiliary film 3c by being separated from the first electrode 5a such that a lower surface of an end portion of the second electrode 5b on the first electrode 5a side faces the end portion of the resistance layer 3a on the second auxiliary film 3c side. The lower surface of the end portion of the second electrode 5b on the first electrode 5a side includes second contact regions 5e and 5f extending to the upper surface of the resistance layer 3a through the second contact holes 4c and 4d, as a protrusion. Electrically, the first electrode 5a, the resistance layer 3a, and the second electrode 5b are connected in series, and realize a resistance element having a step-wise steric structure.

Figure 4:
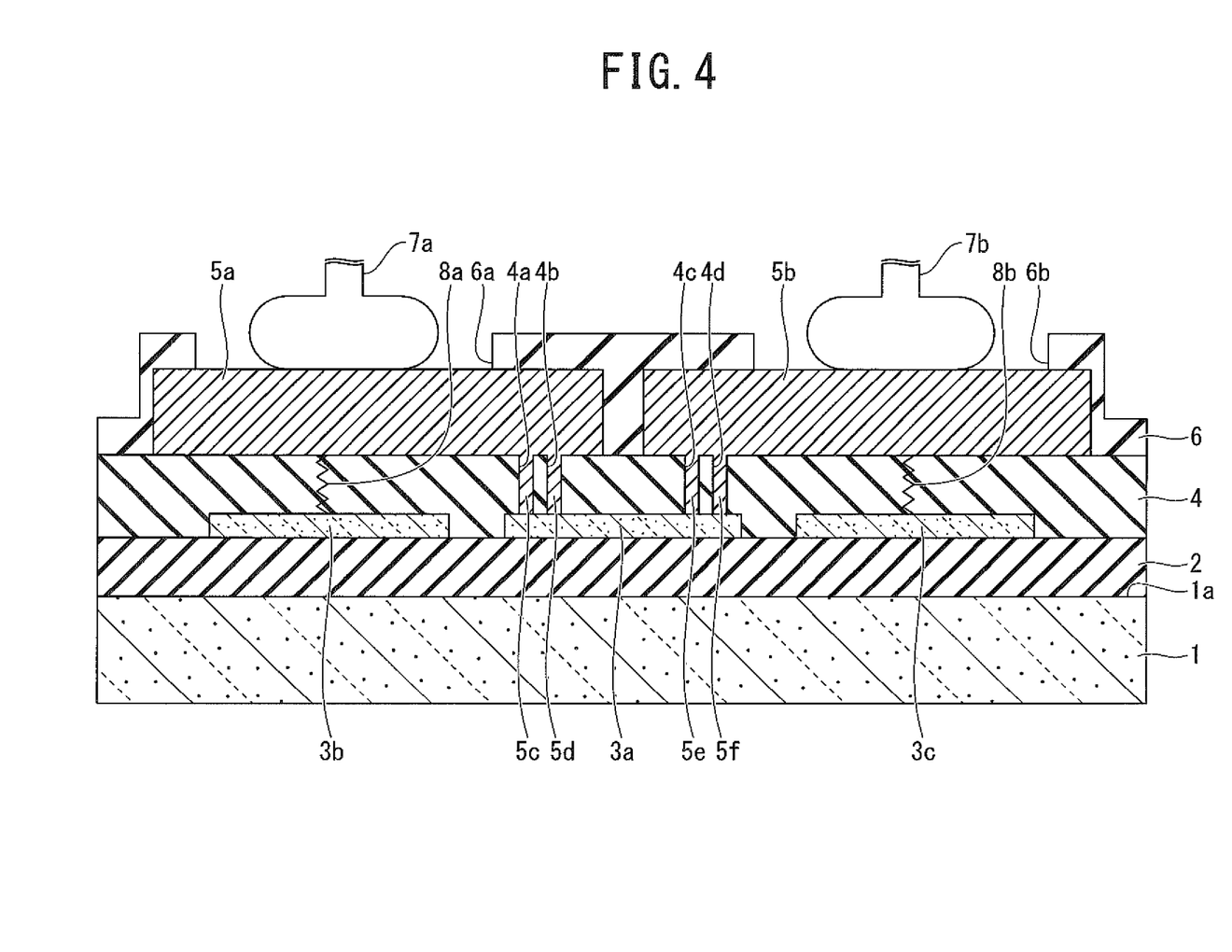
FIG. 4 is a sectional view illustrating an effect of the resistance element according to the embodiment of the invention.

As illustrated in FIG. 2, the first electrode 5a and the second electrode 5b include a rectangular planar pattern having the transverse direction of the resistance element as the longitudinal direction. The thickness of the first electrode 5a and the second electrode 5b, for example, is approximately 3 μm. For example, a laminated film of titanium/titanium nitride (Ti/TiN) of approximately 100 nm to 130 nm, as a barrier metal, aluminum-silicon (Al-Si) of approximately 3 μm, TiN/Ti of approximately 35 nm to 55 nm, as an antireflection film, can be used as the first electrode 5a and the second electrode 5b. In addition, the first electrode 5a and the second electrode 5b, for example, may be an Al alloy such as Al, Al—Cu—Si, and Al—Cu, instead of Al—Si. The first electrode 5a and the second electrode 5b configure an electrode pad. Then, bonding wires 7a and 7b that are made of a metal such as Al and have a diameter of approximately 200 μm to 400 μm, illustrated in FIG. 4, are connected to the first electrode 5a and the second electrode 5b.

For example, a composite film in which a TEOS film, an $Si_3N_4$ film, and a polyimide film are laminated can be used as the protective film 6. In the protective film 6, opening portions 6a and 6b are provided in a position facing the center portion of the first electrode 5a and the center portion of the second electrode 5b. A portion of the first electrode 5a and the second electrode 5b exposed from the opening portions 6a and 6b, is a pad region that can be connected to the bonding wires 7a and 7b illustrated in FIG. 4.

As described above, the resistance element according to the embodiment of the invention, includes the first auxiliary film 3b and the second auxiliary film 3c separated from the resistance layer 3a, on a lower side of the first electrode 5a and on a lower side of the second electrode 5b on the first insulating film 2, respectively. Therefore, for example, as illustrated in FIG. 4, in a case where cracks 8a and 8b are generated in the second insulating film 4 from the first electrode 5a or the second electrode 5b when the bonding wires 7a and 7b are connected to the first electrode 5a or the second electrode 5b, the first auxiliary film 3b and the second auxiliary film 3c, that is, a member separated (insulating-isolated) from the resistance layer 3a can be a stopper for stopping the progress of the cracks 8a and 8b. For this reason, for example, unlike a case where the resistance layer 3a extends on the lower side of the first electrode 5a or the lower side of the second electrode 5b, and thus, functions as the stopper of the cracks 8a and 8b, it is possible to provide a resistance element that is capable of preventing a short circuit between the first electrode 5a and the resistance layer 3a, or a short circuit between the second electrode 5b and the resistance layer 3a.

Furthermore, in the resistance element described in PTL 1, a resistance film is provided on a lower side of a pad region. Therefore, in a case where a crack is generated in an insulating film between the pad region and the resistance film, a short circuit occurs between the pad region and the resistance film, and thus, a characteristic defect such as a change in an effective resistance value, may occur.

In addition, the resistance element according to the embodiment of the invention includes the stopper of the cracks 8a and 8b on the lower side of the pad region, and thus, it is not necessary to increase the thickness of the first electrode 5a, the second electrode 5b, the second insulating film 4, or the first insulating film 2 for stopping the progress or the generation of the cracks 8a and 8b, and it is possible to reduce a manufacturing cost. In addition, it is not necessary to perform a screening test that rejects the generation of the crack.

Incidentally, for example, in a vertical resistance element in which a resistance layer and a first electrode are provided on one surface of a semiconductor substrate in this order, and a second electrode is provided on the other surface side, a parallel flat plate made of the first electrode and the second electrode (the pad region) facing each other, can be a capacitance component. Therefore, in a high-frequency operation environment, there is a possibility that the pad region may hinder resistance operation characteristics as a parasitic capacitance component.

In contrast, in the resistance element according to the embodiment of the invention, the resistance layer 3a, and the first electrode 5a and the second electrode 5b are provided on one surface 1a side of the semiconductor substrate 1, and thus, a parallel flat plate structure in which the first electrode 5a and the second electrode 5b (the pad region) face each other is not obtained and does not contribute as a large capacitance component, and therefore, it is possible to suppress a parasitic capacitance component. For this reason, it is possible to perform a resistance operation in a higher frequency region, and an application range expands.

In addition, from the viewpoint of a structure in which a voltage is not applied in a thickness direction of the resistance layer 3a, it is not necessary to increase the thickness of the second insulating film 4 or the first insulating film 2, and it is possible to reduce the manufacturing cost. Further, electric characteristics of the semiconductor substrate 1 do not affect the resistance value, and thus, the specification of the semiconductor substrate 1 is not important, and it is possible to reduce a material cost. Therefore, according to the resistance element according to the embodiment of the invention, it is possible to realize a thin film resistor with an excellent high-frequency operation and a low manufacturing cost, compared to the vertical resistance element.

As described below, the first auxiliary film 3b and the second auxiliary film 3c configuring the resistance element according to the embodiment of the invention, can be simultaneously formed of a material identical to that of the resistance layer 3a. Therefore, it is possible to reduce time and effort for forming the first auxiliary film 3b and the second auxiliary film 3c.

Manufacturing Method of Resistance Element

Next, a manufacturing method of a resistance element according to the embodiment of the invention will be described with reference to FIG. 5 to FIG. 13. Furthermore, the manufacturing method of a resistance element described below, numerical values or materials exemplarily described, and the like are an example, and it is obvious that the resistance element according to the embodiment of the invention can be realized by various manufacturing methods other than the manufacturing method of a resistance element insofar as being within the scope of the gist described in the claims.

Figure 5:
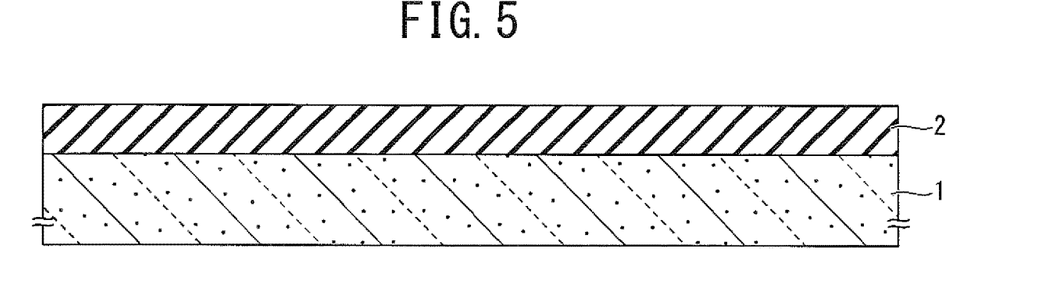
FIG. 5 is a process sectional view for illustrating an example of a manufacturing method of a resistance element according to the embodiment of the invention.

First, the semiconductor substrate 1 such as the silicon substrate to which the n-type impurity is added at a high concentration is prepared. Then, a p-type semiconductor region, an n-type semiconductor region, and the like configuring an active area of the semiconductor device are formed on the surface of the semiconductor substrate 1 or in the semiconductor substrate 1. Subsequently, as illustrated in FIG. 5, the first insulating film 2 such as a TEOS film is deposited on the semiconductor substrate 1 on which the active area (not illustrated) is configured. For example, a low-pressure CVD method (a reduced pressure CVD method) and the like can be used as a deposition method of the first insulating film 2. Furthermore, the first insulating film 2 may be formed of a composite film in which a thermally oxidized film is formed by a thermal oxidation method, and then, the insulating film is deposited on the thermally oxidized film by a CVD method and the like, and the thermally oxidized film and the deposited insulating film are laminated.

Figure 6:
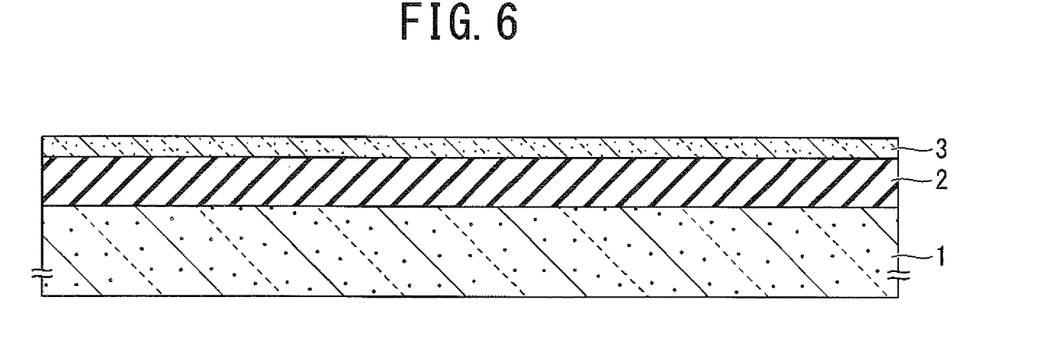
FIG. 6 is a process sectional view subsequent to FIG. 5 for illustrating an example of the method of a resistance element according to the embodiment of the invention.
Figure 7:
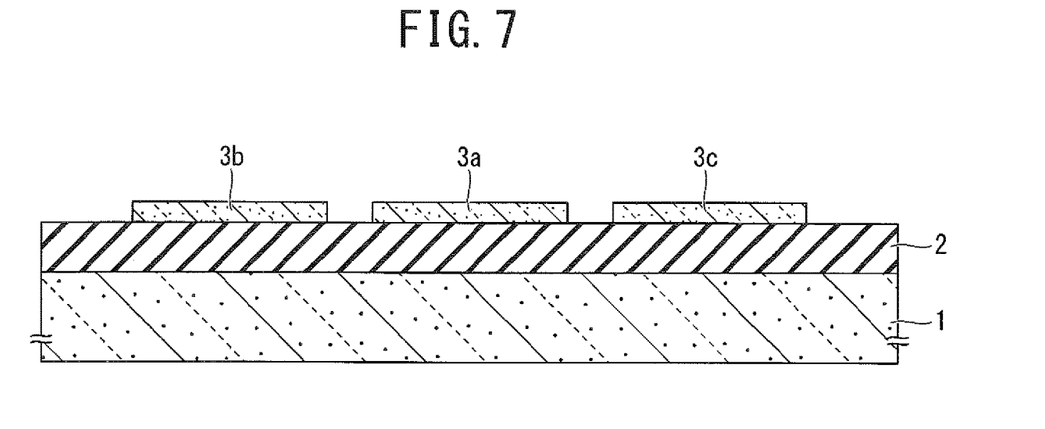
FIG. 7 is a process sectional view subsequent to FIG. 6 for illustrating an example of the method of a resistance element according to the embodiment of the invention.

Next, a non-doped polysilicon layer is formed on the semiconductor substrate 1 and the first insulating film 2. For example, a CVD method and the like can be used as a formation method of the polysilicon layer, and the polysilicon layer can be formed by depositing on the entire surface of the first insulating film 2. Then, the n-type impurity such as phosphorus (P) is ion-implanted with respect to the polysilicon layer. For example, phosphorus (P) having an acceleration voltage of approximately 80 keV and a dose amount of approximately less than or equal to $6.0 \times 10^{15}$ cm$^{-2}$ is ion-implanted. After that, the implanted ion is activated according to a thermal treatment, and as illustrated in FIG. 6, the doped-polysilicon layer 3 to which the n-type impurity is added at a high concentration is formed. The doped-polysilicon layer 3 may be formed by adding an impurity element from the gas phase at the time of performing deposition according to a CVD method, instead of adding the impurity according to the ion implantation. Subsequently, a photoresist film is applied onto the doped-polysilicon layer 3, and the photoresist film is patterned by using a photolithography technology. The patterned photoresist film is used as an etching mask, and a part of the doped-polysilicon layer 3 is selectively removed according to reactive ion etching (RIE) and the like, and thus, the doped-polysilicon layer 3 is patterned. After that, the photoresist film is removed. As a result, as illustrated in FIG. 7, the first auxiliary film 3b, the resistance layer 3a and the second auxiliary film 3c are formed on the first insulating film 2 to be separated from each other. In corresponding FIG. 2, it is illustrated that the first auxiliary film 3b is a planar pattern separated from the resistance layer 3a, and the second auxiliary film 3c is a planar pattern separated from the resistance layer 3a in a direction opposite to (a direction different from) that of the first auxiliary film 3b. Furthermore, the first auxiliary film 3b, the resistance layer 3a, and the second auxiliary film 3c have approximately the same impurity concentration and approximately the same sheet resistance.

Figure 8:
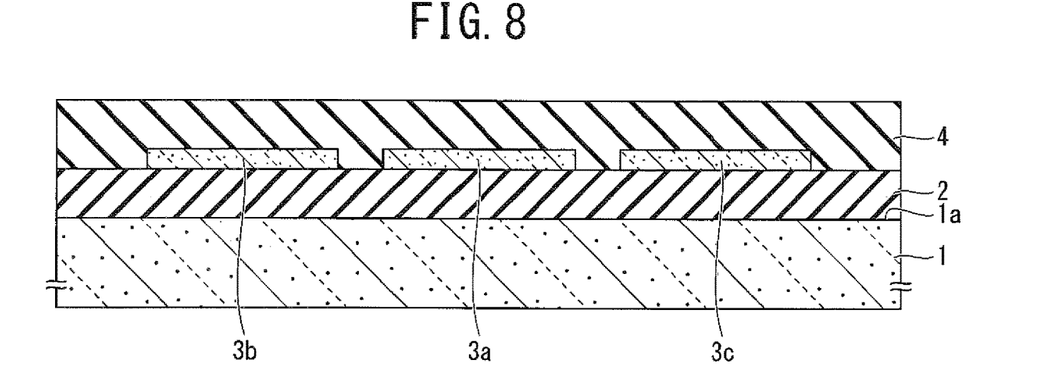
FIG. 8 is a process sectional view subsequent to FIG. 7 for illustrating an example of the method of a resistance element according to the embodiment of the invention.
Figure 9:
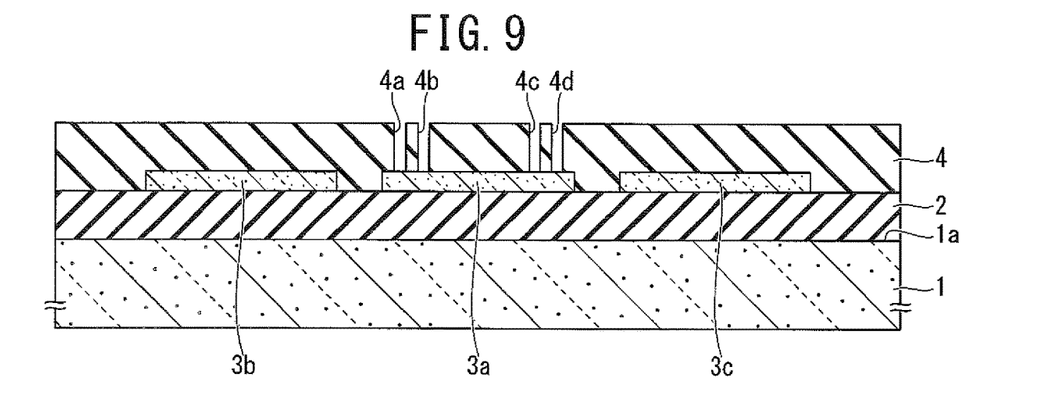
FIG. 9 is a process sectional view subsequent to FIG. 8 for illustrating an example of the method of a resistance element according to the embodiment of the invention.

Next, as illustrated in FIG. 8, the second insulating film 4 is deposited to cover the first insulating film 2, the resistance layer 3a, the first auxiliary film 3b, and the second auxiliary film 3c. For example, the second insulating film 4 can be formed of a composite film in which the NSG film and the PSG film are sequentially deposited according to a CVD method and the like, and the NSG film and the PSG film are laminated. Subsequently, a photoresist film is applied onto the second insulating film 4, and the photoresist film is patterned by using a photolithography technology. The patterned photoresist film is used as an etching mask, and a part of the second insulating film 4 is selectively removed according to RIE and the like, and thus, a boring pattern is formed in a part of the second insulating film 4. After that, the photoresist film is removed. As a result, as illustrated in FIG. 9, the first contact holes 4a and 4b, and the second contact holes 4c and 4d penetrate through the second insulating film 4.

Figure 10:
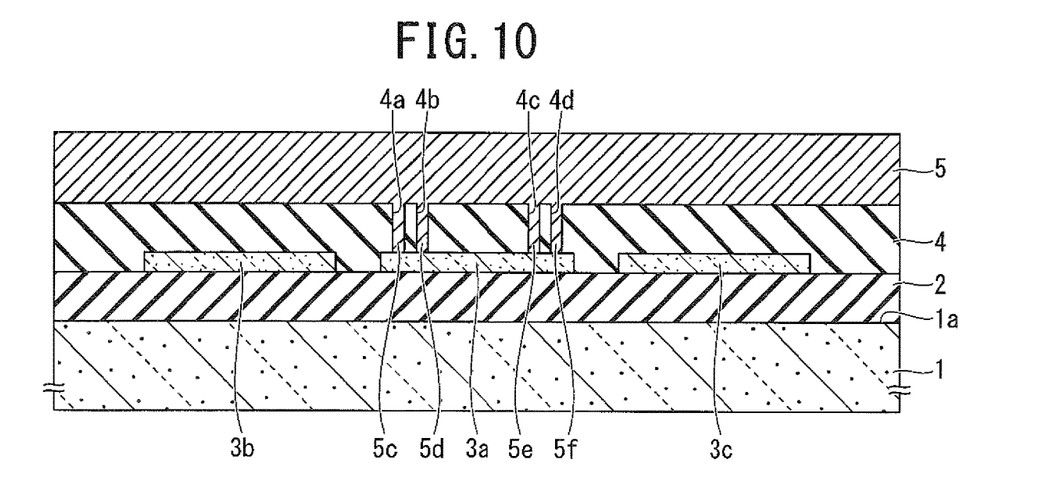
FIG. 10 is a process sectional view subsequent to FIG. 9 for illustrating an example of the method of a resistance element according to the embodiment of the invention.
Figure 11:
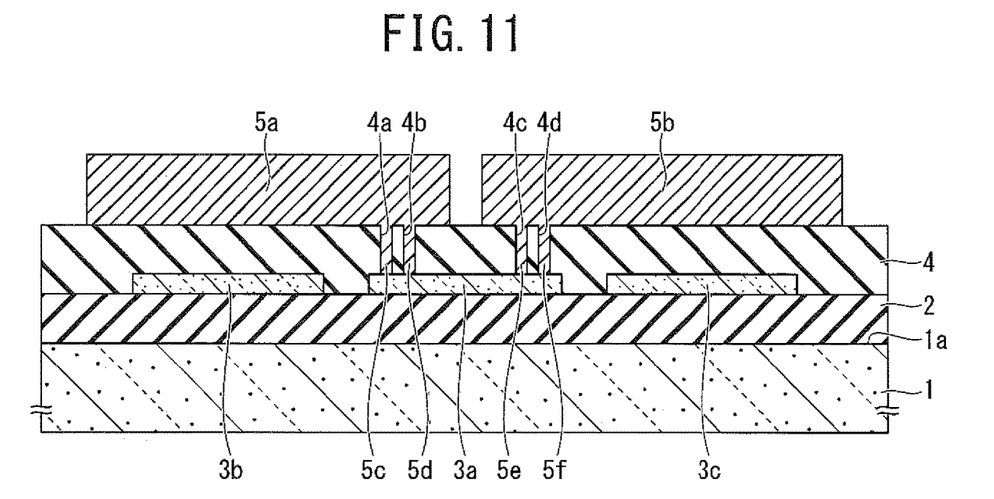
FIG. 11 is a process sectional view subsequent to FIG. 10 for illustrating an example of the method of a resistance element according to the embodiment of the invention.

Next, as illustrated in FIG. 10, a metal film 5 is deposited on the second insulating film 4 according to a vacuum vapor deposition method, a sputtering method, and the like such that the inside of each of the contact holes 4a to 4d is buried. For example, the metal film 5 can be formed of a composite film in which Ti/TiN, Al—Si, and TiN/Ti are sequentially deposited according to a CVD method and the like, and Ti/TiN, Al—Si, and TiN/Ti are laminated. Subsequently, a photoresist film is applied onto the metal film 5, and the photoresist film is patterned by using a photolithography technology. The patterned photoresist film is used as an etching mask, a part of the metal film 5 is selectively removed according to RIE and the like, and the metal film 5 is patterned. After that, the photoresist film is removed. As a result, as illustrated in FIG. 11, the first electrode 5a and the second electrode 5b are formed on the second insulating film 4. At this time, simultaneously, the first contact regions 5c and 5d of the first electrode 5a are formed through the first contact holes 4a and 4b, and the second contact regions 5e and 5f of the second electrode 5b are formed through the second contact holes 4c and 4d. That is, the pattern of the first electrode 5a connected to one end portion of the resistance layer 3a is formed on the upper side of the first auxiliary film 3b through the first contact holes 4a and 4b. Simultaneously, the pattern of the second electrode 5b connected to the other end portion of the resistance layer 3a is formed on the upper side of the second auxiliary film 3c through the second contact holes 4c and 4d.

Figure 12:
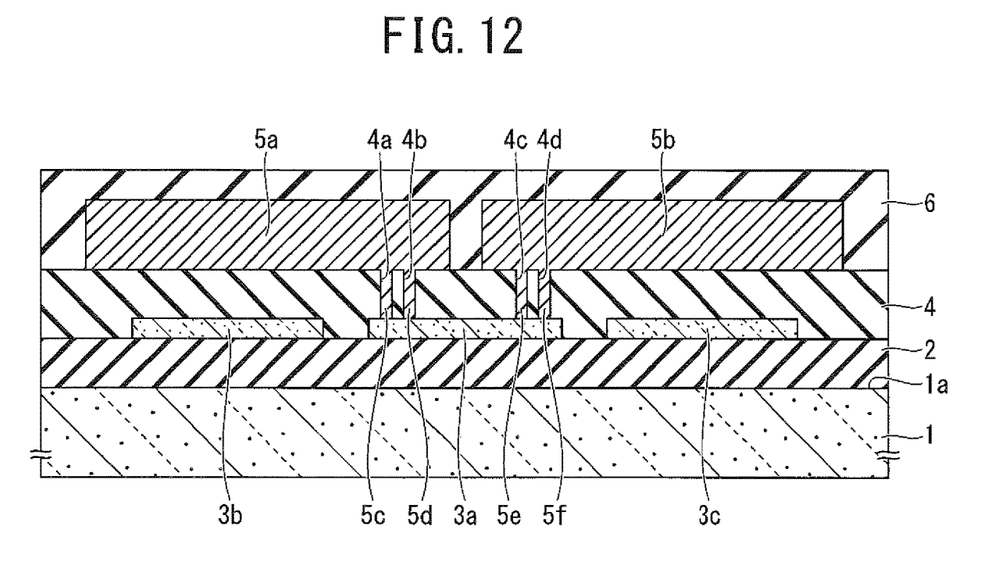
FIG. 12 is a process sectional view subsequent to FIG. 11 for illustrating an example of the method of a resistance element according to the embodiment of the invention.
Figure 13:
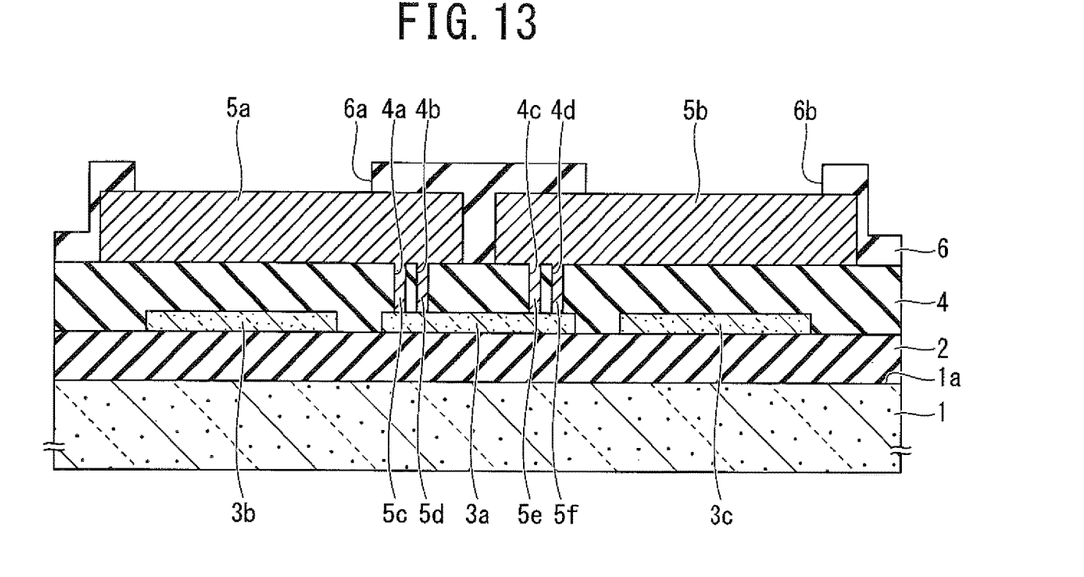
FIG. 13 is a process sectional view subsequent to FIG. 12 for illustrating an example of the method of a resistance element according to the embodiment of the invention.

Next, as illustrated in FIG. 12, the protective film 6 is formed on the first electrode 5a, the second electrode 5b and the second insulating film 4 such that a gap between the first electrode 5a and the second electrode 5b and the like are buried. For example, the protective film 6 can be formed of a composite film in which the TEOS film and the $Si_3N_4$ film are sequentially deposited according to a plasma CVD method and the like, and then, the polyimide film is applied onto the $Si_3N_4$ film, and thus the TEOS film, the $Si_3N_4$ film, and the polyimide film are laminated. Subsequently, a photoresist film is applied onto the protective film 6, and the photoresist film is patterned by using a photolithography technology. The patterned photoresist film is used as an etching mask, a part of the protective film 6 is selectively removed according to RIE and the like, and a window portion is formed in a part of the protective film 6. After that, the photoresist film is removed. As a result, as illustrated in FIG. 13, the opening portions 6a and 6b are formed in the protective film 6, and the pad region is formed by the center portion of the first electrode 5a and the second electrode 5b exposed from the opening portions 6a and 6b.

Next, a lower surface of the semiconductor substrate 1 is polished according to chemical mechanical polishing (CMP) and the like, and the thickness of the semiconductor substrate 1 is reduced to approximately 350 µm. As a result, as illustrated in FIG. 1, the resistance element according to the embodiment of the invention is manufactured. Furthermore, in the actual manufacturing process, a plurality of elements identical to the resistance element illustrated in FIG. 1 are formed on one wafer as a matrix-like chip region. Then, the chip region is isolated into a chip of the resistance element illustrated in FIG. 1, according to dicing. Furthermore, it is not necessary that the active area of the semiconductor device described above exists on a lower side of the resistance element illustrated in FIG. 1, and the layout of the chip region in which the chip of the resistance element and a chip of the active area of the semiconductor device are cut out as a separate chip may be set on the semiconductor substrate 1.

According to the manufacturing method of a resistance element according to the embodiment of the invention, it is possible to easily realize a resistance element capable of preventing a short circuit between the first electrode 5a and the resistance layer 3a, and a short circuit between the second electrode 5b and the resistance layer 3a.

As described above, the embodiment of the invention has been described, but it will be understood that the description and Drawings configuring a part of this disclosure do not limit the invention. Various alternative embodiments, examples, and operation technologies will be apparent to a person skilled in the art from this disclosure.

What is claimed is:

1. A resistance element, comprising:
    a semiconductor substrate;
    a first insulating film stacked on the semiconductor substrate;
    a resistance layer selectively stacked on the first insulating film;
    a first auxiliary film separated from the resistance layer;
    a second auxiliary film separated from the resistance layer in a direction different from a direction of the first auxiliary film, the first and second auxiliary films being conductive films;
    a second insulating film stacked on the first insulating film, the resistance layer, and the first auxiliary film and the second auxiliary film;
    a first electrode connected to the resistance layer and stacked on a first portion of the second insulating film disposed on an upper side of the first auxiliary film, such that the first electrode and the first auxiliary film are insulated from each other; and
    a second electrode connected to the resistance layer, separated from the first electrode, and stacked on a second portion of the second insulating film on an upper side of the second auxiliary film, such that the second electrode and the second auxiliary film are insulated from each other.

2. The resistance element according to claim 1, wherein the first auxiliary film and the second auxiliary film are made of a material identical to a material of the resistance layer.

3. The resistance element according to claim 1, wherein the second insulating film is provided on the first insulating film, the resistance layer, the first auxiliary film, and the second auxiliary film, and provided between the resistance layer and the first auxiliary film, and between the resistance layer and the second auxiliary film, such that the resistance layer, the first auxiliary film and the second auxiliary film are insulated from each other.

* * * * *